(12) United States Patent
Balusu

(10) Patent No.: US 11,032,908 B2
(45) Date of Patent: Jun. 8, 2021

(54) CIRCUIT BOARD, ASSEMBLY AND METHOD OF ASSEMBLING

(71) Applicant: Honeywell International Inc., Morris Plaines, NJ (US)

(72) Inventor: Sreenivasu Balusu, Bangalore (IN)

(73) Assignee: UOP LLC, Des Plaines, IL (US)

( * ) Notice: Subject to any disclaimer, the term of this patent is extended or adjusted under 35 U.S.C. 154(b) by 0 days.

(21) Appl. No.: 16/672,193

(22) Filed: Nov. 1, 2019

(65) Prior Publication Data

US 2020/0389977 A1    Dec. 10, 2020

(51) Int. Cl.
*H05K 1/11*    (2006.01)
*H05K 1/14*    (2006.01)
*H05K 3/36*    (2006.01)

(52) U.S. Cl.
CPC ............ *H05K 1/144* (2013.01); *H05K 1/113* (2013.01); *H05K 1/117* (2013.01); *H05K 1/141* (2013.01); *H05K 3/368* (2013.01); *H05K 2201/09618* (2013.01)

(58) Field of Classification Search
USPC .......................................................... 361/792
See application file for complete search history.

(56) References Cited

U.S. PATENT DOCUMENTS

| | | | |
|---|---|---|---|
| 6,496,384 B1* | 12/2002 | Morales | H05K 3/366 29/830 |
| 6,818,477 B2 | 11/2004 | Veitschegger et al. | |
| 8,587,019 B2 | 11/2013 | Yan et al. | |
| 8,710,514 B2 | 4/2014 | Andrews et al. | |
| 9,029,741 B2 | 5/2015 | Montoya et al. | |
| 2009/0034222 A1* | 2/2009 | Smith | H05K 3/366 361/803 |

* cited by examiner

*Primary Examiner* — Andargie M Aychillhum
(74) *Attorney, Agent, or Firm* — Paschall & Associates, LLC; James C. Paschall

(57) ABSTRACT

Discovered is a daughter circuit board for direct connection to another mother circuit board. The daughter circuit board has an edge electrode for conductive connection to a surface pad on the mother board. An opening in the daughter circuit board can be aligned with the surface pad on the mother circuit board. The opening can contain solder which when reflowed can establish a bond between the daughter circuit board and the surface pad on the mother circuit board.

18 Claims, 4 Drawing Sheets

CIRCUIT BOARD, ASSEMBLY AND METHOD OF ASSEMBLING

FIELD

The field is electrical circuit boards and specifically assemblies of circuit boards.

BACKGROUND

Circuit boards are insulative boards typically made of a glass reinforced epoxy laminate material such as FR-4 on which are circuitry is fixed or printed to conduct an electrical function or process. The circuit traces define one or more circuits on the circuit board and connect to electrical components also supported on or in the circuit board.

In some cases, circuit board to circuit board soldering is a feature of an electrical product. A common example is a planar transformer which is a circuit board that will be soldered to a main circuit board. This soldering may be preferable to avoid other types of interfaces that will lead to functional issues for the assembly.

Circuit board to circuit board soldering may be economical and most preferred due to a variety of reasons. When a reflow soldering is preferred, an edge plating on the smaller circuit board may be directly assembled to establish conductive bonding to the surface mount pads of the main circuit board. Edge plating comprises an edge mounted conductive pad that extends down an edge of the circuit board perhaps from a surface mount pad on a top surface of the circuit board and perhaps to a surface mount pad on a bottom surface of the circuit board. Solder applied between the edge plating and a surface mount pad on the main circuit board establishes the conductive bond that provides for electrical connection. However, the solder bond is also relied upon to maintain the mechanical connection. Typical circumstances can exert forces that will cause the conductive bond to break.

Electrical connectors can be used to interface between circuit boards, but in certain cases are not preferred such as when sliding joints of a connector may effect components that are sensitive to magnetic emissions, cost constraints are prohibitive, decoupling the boards during use is not necessary, and when space constraints and/or circuit length are of concern.

As circuit board to circuit board connections are produced and used in greater volume, there is a greater need for ways of directly connecting circuit boards in a reliable and robust manner.

BRIEF SUMMARY

Discovered is a daughter circuit board for direct connection to another mother circuit board. The daughter circuit board has an edge electrode for conductive connection to a surface pad on the main board. An opening in the daughter circuit board can be aligned with a surface pad on the main circuit board. The opening can contain solder which when reflowed can establish a bond between the daughter circuit board and the surface pad on the main circuit board.

DETAILED DESCRIPTION

Figure 1:
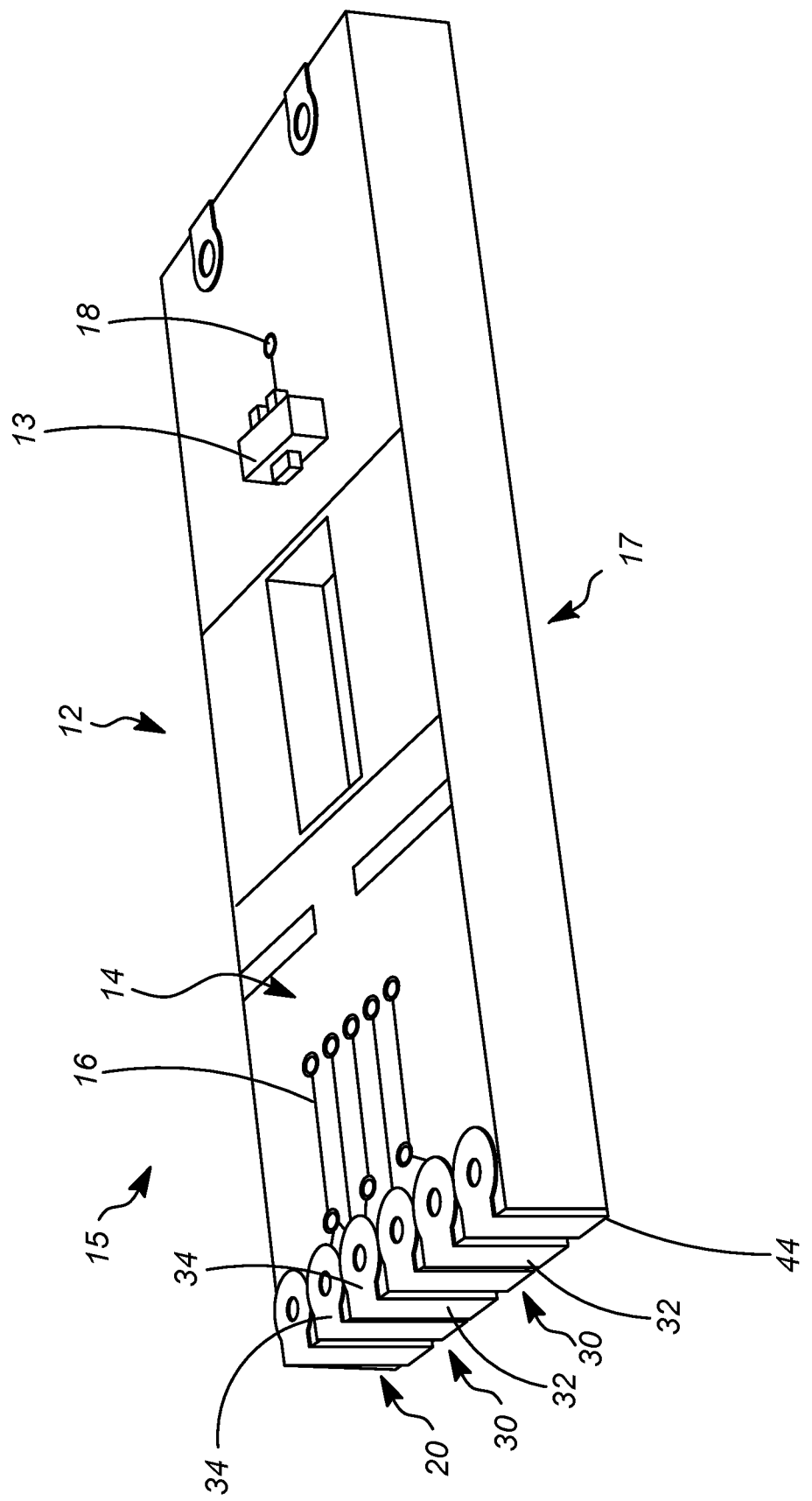
FIG. 1 is an isometric view of a daughter circuit board.

We have discovered a circuit board that may be assembled on a main circuit board with a reliable and robust conductive bond. A dependent, auxiliary or daughter circuit board 12 shown in FIG. 1 may comprise an electrically insulative material such as glass reinforced epoxy known as FR-4 having a planar first top surface 14 supporting circuitry 15. The circuitry may include electrical components 13 electrically connected by conductive metallized traces 16 provided on the daughter circuit board 12 on the first top surface 14, inside the daughter circuit board 12 and/or on a planar first bottom surface 17. Vias or through holes 18 in the first top surface 14 may include metallized plating around the hole on the first top surface and plating in the hole for providing an electrically conductive connection between the first top surface 14 and a layer of circuitry inside the daughter circuit board 12 or on the first bottom surface 17. A leading edge 20 is provided at a leading end of the daughter circuit board 12. The daughter circuit board 12 may be assembled to or mounted on a mother circuit board 22.

The daughter circuit board 12 is equipped with an edge electrode 30. The daughter circuit board 12 may be equipped with a plurality of edge electrodes 30. The edge electrode 30 is for directly connecting circuitry 15 on the daughter circuit board 12 to circuitry 25 on a mother circuit board 22, shown in FIG. 2. The edge electrode 30 includes a conductive edge plating or trace 32 on the leading edge 20. The edge trace 32 may extend from the first top surface 14 down said leading edge 20 to the first bottom surface 17. The edge trace 32 provides conductive connection along its height. In an aspect, the edge electrode 30 may include a first top surface pad 34 on the first top surface 14 conductively contiguous with and orthogonal to the conductive edge trace 32 on the leading edge 20. In a further aspect, the edge electrode 30 may include a first bottom surface pad 44 on the first bottom surface 17 conductively contiguous with and orthogonal to the conductive edge trace 32 on the leading edge 20.

A plurality of edge electrodes 30 may include respective conductive edge traces 32 on the leading edge 20. A plurality of edge electrodes 30 may each include respective first top surface pads 34 on the first top surface 14 conductively contiguous with and orthogonal to respective conductive edge traces 32 on the leading edge 20. A plurality of edge electrodes 30 may each include respective first bottom surface pads 44 on the first bottom surface 17 conductively contiguous with and orthogonal to respective conductive edge traces 32 on the leading edge 20.

Figure 2:
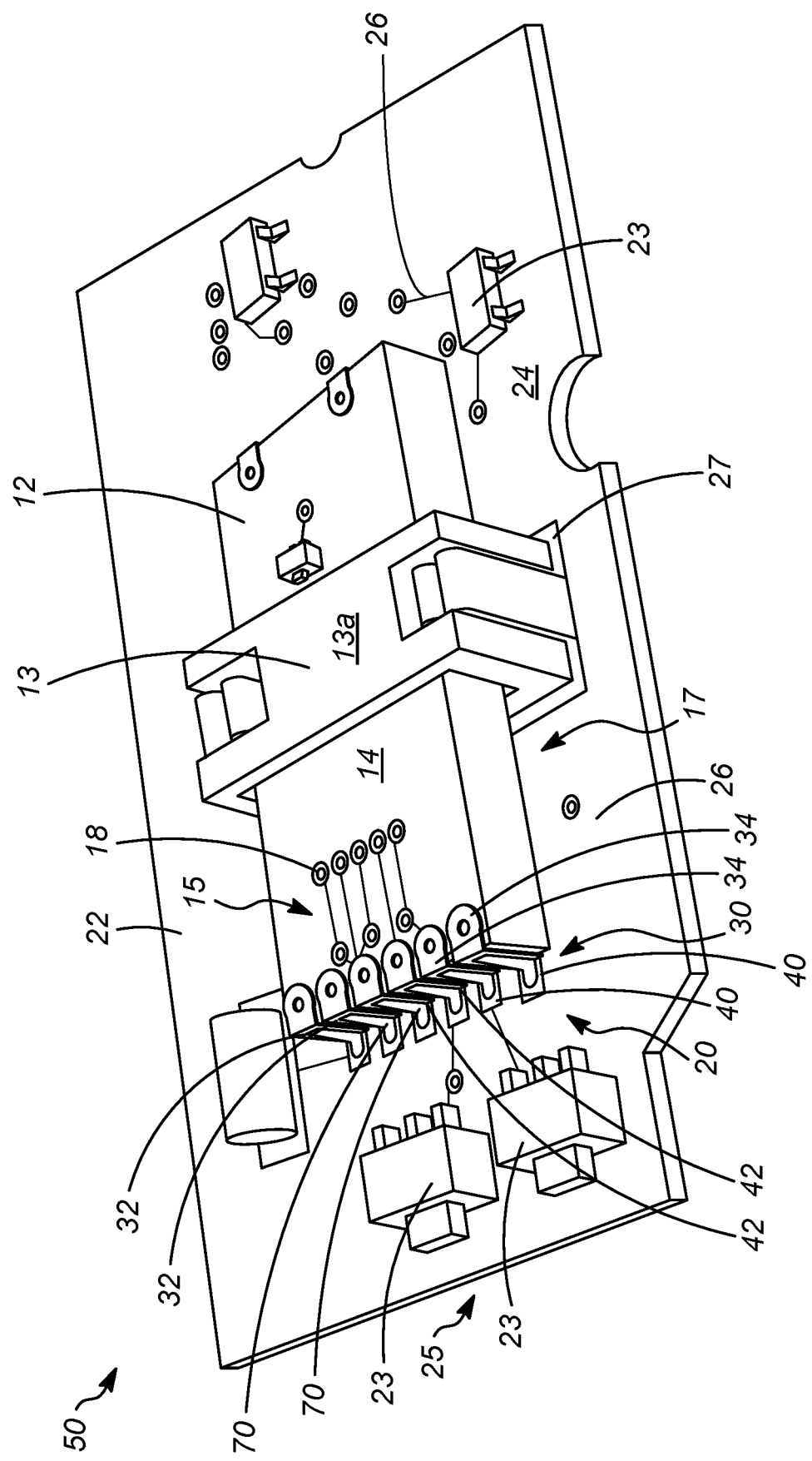
FIG. 2 is an isometric view of the daughter circuit board assembled to a mother circuit board.

FIG. 2 shows the daughter board 12 assembled to a mother board 22. The mother or main circuit board 22 may comprise an electrically insulative material such as glass reinforced epoxy known as FR-4 having a planar second top surface 24 supporting circuitry 25. The circuitry 25 includes electrical components 23 electrically connected by conductive metallized traces 26 provided on the mother circuit board 22 on the second top surface 24, inside the mother circuit board 22 and/or on a second bottom surface (not shown in FIG. 2). Vias or through holes 28 in the second top surface 24 may include metallized plating around the hole on the second top surface 24 and plating in the hole for providing electrically conductive connection between the second top surface 24 and a layer of circuitry inside the mother circuit board 22 or on the second bottom surface (not shown in FIG. 2). The daughter circuit board 12 is assembled to the mother circuit board 22, so as to connect circuitry 15 on the daughter circuit board 12 to the circuitry 25 on the mother circuit board 22 and vice versa. Electrical components 13 on the daughter circuit board 12 include a transformer 13a on the daughter circuit board 12. The transformer 13a extends over and on the daughter circuit board 12 and through a slot 27 in the mother circuit board 24.

The mother circuit board 20 may be equipped with a conductive second top surface pad 40 horizontally aligned with the edge trace 32 when the daughter circuit board 12 and the mother circuit board are assembled together. Solder 70 may be reflowed at a junction 42 of the edge trace 32 of the daughter circuit board 12 and the second top surface pad 40 of the mother circuit board 22 to metallurgically and conductively bond the edge trace 32 with the second top surface pad 40, thus providing a conductive and metallurgical connection between the edge electrode 30 and the second top surface pad 40. Moreover, the first top surface pad 34 may be conductively connected to the second top surface pad 40 through the edge trace 32 metallurgically and conductively bonded to the second top surface pad 40.

In an embodiment, the mother circuit board 20 may be equipped with a plurality of conductive second top surface pads 40 each horizontally aligned with a respective one of a plurality of edge traces 32 when the daughter circuit board 12 and the mother circuit board are assembled together. Solder 70 may be reflowed at a respective junction 42 of one of the edge traces 32 and a respective one of the second top surface pads 40 to metallurgically and conductively bond the one of the edge traces 32 with the respective one of the second top surface pads 40, thus providing a conductive connection between one of the first top surface pads 34 and the respective one of the second top surface pads 40. Moreover, one of the first top surface pads 34 may be conductively connected to a respective one of the second top surface pads 40 through the respective one of the edge traces 32 metallurgically and conductively bonded to the respective one of the second top surface pads 40. Consequently, circuitry 15 on the daughter circuit board 12 is electrically connected with circuitry 25 on the mother circuit board 22.

Figure 3:
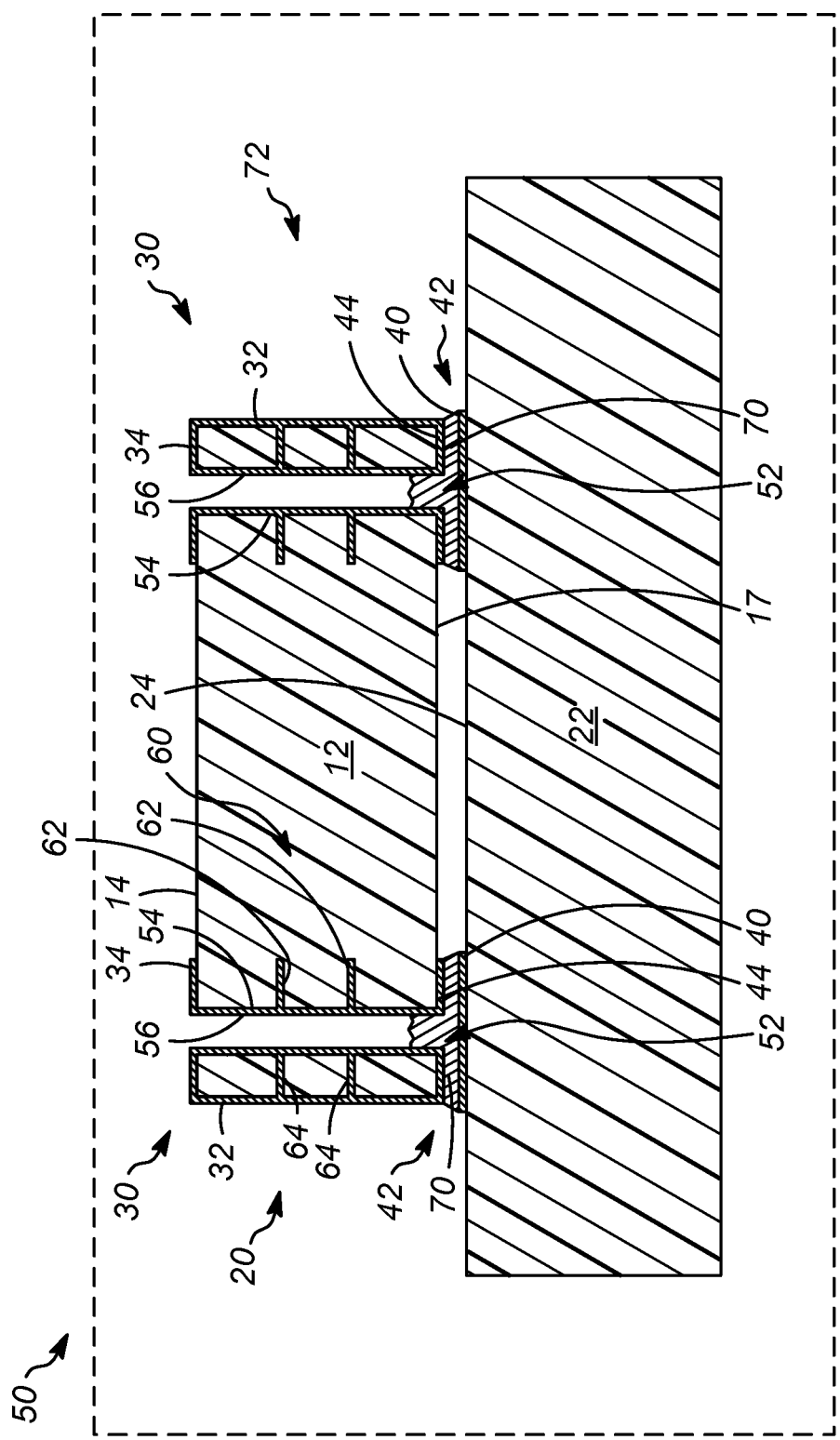
FIG. 3 is a longitudinal sectional view of the board assembly.

FIG. 3 shows a longitudinal sectional view of the daughter circuit board 12 and the mother circuit board 22 of FIG. 1 assembled together in an assembly. A cross section of an edge electrode 30 is depicted in FIG. 3. In FIG. 3, the first bottom surface 17 of the daughter circuit board is visible. The edge trace 32 extends from the first top surface 14 down the leading edge 20 to the first bottom surface 17. The edge trace 32 is horizontally aligned with the second top surface pad 40 which both meet at the junction 42 in the assembly 50. At the junction 42, the edge trace 32 and the second top surface pad 40 are metallurgically and conductively bonded together with solder 70.

The first top surface pad 34 may be located on the first top surface 14 of the daughter circuit board 12. The first top surface pad 34 may be unitary with the respective edge trace 32. The second top surface pad 40 is located on the second top surface 24 of the mother circuit board 22. The edge trace 32 provides electrically conductive connection between the first top surface pad 34 and the second top surface pad 40.

The daughter circuit board 12 may include a conductive first bottom surface pad 44. The first bottom surface pad 44 may be horizontally aligned with a second top surface pad 40 in the assembly 50. Solder 70 between the first bottom surface pad 44 and the second top surface pad 40 at the junction 42 may establish a metallurgical and conductive bond between the first bottom surface pad 44 and the second top surface pad 40. The first top surface pad 34 may be unitary with the respective edge trace 32 and the first bottom surface pad 44.

The daughter circuit board 12 assembled with or mounted to the mother circuit board 20 provides the circuit board assembly 50. The edge electrode 30 directly soldered to the second top surface pad 40 may be relied on to maintain an electrical and structural bond between the circuitry 15 on the daughter circuit board and circuitry 25 on the mother circuit board 20. As the assembly 50 is subjected to normal jostling and handling during transport and use, the solder bond must resist breaking to maintain the electrical function and the structural function.

To improve the robustness of the electrical and structural bond for the edge electrode 30 to the second surface pad 40, it is proposed to provide an opening 52 in the daughter circuit board 12. The opening 52 may be horizontally aligned with the second top surface pad 40 in the assembly 50. The opening 52 in the daughter circuit board 12 contains solder 70 that establishes a conductive and metallurgical bond between the daughter circuit board and the second top surface pad 40. Not all of the solder that establishes the bond is contained in the opening 52, but the solder in the opening that establishes the bond with the opening is unitary with the solder that is conductively and metallurgically bonded to the second top surface pad 40.

The opening 52 may comprise a bore and that is defined by an interior wall 54 which is plated with a metallized conductive annular plating 56. The annular plating 56 may provide a conductive connection between the first top surface pad 34 through said opening 52 to the first bottom surface pad 44. Moreover, the annular plating 56 may provide a conductive connection between the first top surface pad 34 through the opening 56 to the first bottom surface pad 44 through the solder 70 at the junction 42 to the second top surface pad 40.

The interior wall 54 may define a cylinder. So, the conductive annular plating 56 may also define a partial or a complete cylinder. The opening 52 may extend from the first bottom surface 17. The opening 52 may extend from the first bottom surface 17 to the first top surface 14. The opening 52 may extend from the first top surface 14. The opening 52 may extend from the first top surface 14 to the second bottom surface 17. The opening 52 may be horizontally aligned with the first top surface pad 34. The opening 52 may be horizontally aligned with the first bottom surface pad 44 upon assembly.

The edge electrode 30 may be equipped with a conductive tab 60 that may be embedded in the daughter circuit board 12. The opening 52 may extend through the tab 60 and establish a conductive connection with the conductive annular plating 56 in the opening 52 in the daughter circuit board 12. The tab 60 may provide structural rigidity to the edge electrode 30 and/or provide electrical connection to circuitry 15 that may be located in the daughter circuit board 12 between the first top surface 14 and the first bottom surface 17. The edge electrode 30 may have more than one tab 60.

The tab 60 may include a back strip 62 that may extend away from the leading edge 20. The tab 60 may also have front strip 64 that may extend toward the leading edge 20. The front strip 64 may connect to the edge trace 32 to provide rigidity thereto and to provide electrical connection between the plating 56 and the edge trace along its height.

The opening 52 may be aligned with and extend through the top surface 14 and/or first top surface pad 34. The opening 52 may be aligned with and extend through the bottom surface 17 and/or first bottom surface pad 44. The edge electrode 30 may comprise the annular plating 56 and the tab 60 which are unitary with each other. The edge electrode 30 may comprise the annular plating 56, the tab 60 and the edge trace 32 which are unitary with each other. The edge electrode 30 may comprise the plating 56, the tab 60, the edge trace 32 and the first bottom surface pad 44 which are unitary with each other. The edge electrode 30 may comprise the plating 56, the tab 60, the edge trace 32 and the first top surface pad 34 which are unitary with each other. The edge electrode 30 may comprise the plating 56, the tab 60, the edge trace 32, the first top surface pad 34 and the first bottom surface pad 44 which are unitary with each other.

The edge electrode 30 may be stamped from a metal sheet, formed into its final shape and the daughter circuit board 12 may be molded around the edge electrode. The plurality of edge electrodes 30 may be stamped from a metal sheet, formed into its final shapes and the daughter circuit board 12 may be molded around the edge electrodes.

Mounting or assembling the daughter circuit board 12 to the mother circuit board 22 is achieved easily. Solder 70 is applied to the second top surface pad 40. Solder can be applied before the daughter circuit board 12 is mounted on the mother circuit board 22. The solder 70 should be applied at the junction 42, particularly where the opening 52 and the second top surface pad 40 meet. Solder 70 paste may be applied to or spread onto the second top surface pad 40 and heated to reflow followed by horizontally aligning the opening 52 with the second top surface pad 40. The daughter circuit board 12 may be mounted on the mother circuit board 22, such that the opening 52 is brought down upon the reflowed solder 70 on the second top surface pad 40.

Solder 70 paste may also be applied into the opening 52. The daughter circuit board 12 may be mounted on the mother circuit board 22, such that the opening 52 is brought down upon on the second top surface pad 40. When the solder 70 is heated, the reflowed solder 70 melts onto the second top surface pad 40 with which the opening 52 is horizontally aligned to establish a metallurgical and conductive bond between the opening 52 and the second top surface pad 40.

It is also envisioned that solder 70 can be injected onto the second top surface pad 40 through the opening 52 after the daughter circuit board 12 is mounted on the mother circuit board 22 with the opening 52 and the second top surface pad 40 horizontally aligned.

Hardening of the reflowed solder 70 establishes a conductive and metallurgical bond between the daughter circuit board 12 and the second top surface pad 40 of the mother circuit board 22. The liquid solder 70 will tend to wick up the opening 52 by capillary action and establish a robust bond between the daughter circuit board 12 and the second top surface pad 40. Annular plating 56 in the opening 52 will enable the solder 70 to establish a metallurgical and conductive bond between the plating 56 in the opening 52 and the second top surface pad 40 to ensure against disconnection. A conductive connection may be established between the first top surface pad 34 through the annular plating 56 in the opening 52 and to the second top surface pad 40. The conductive connection may be established between the first top surface pad 34 through the annular plating 56 in the opening 52 and through the first bottom surface pad 44 to the second top surface pad 40. The solder 70 may also likely be squeezed toward the leading edge 20 to establish a conductive and metallurgical bond between the edge trace 32 and the second top surface pad 40. Assembly of the daughter board 12 to the mother board 22 to provide the assembly 50 may be automated.

The first top surface pad 34 may be horizontally aligned with the opening 52. The first bottom surface pad 44 may also be horizontally aligned with the opening 52 and conductively and metallurgically bonded to the second top surface pad 40 by virtue of the solder 70 sandwiched between the first bottom surface pad and the second top surface pad. FIG. 3 illustrates that electrodes 30 of similar configuration can be utilized at both the leading edge 20 and a trailing edge 72.

Figure 4:
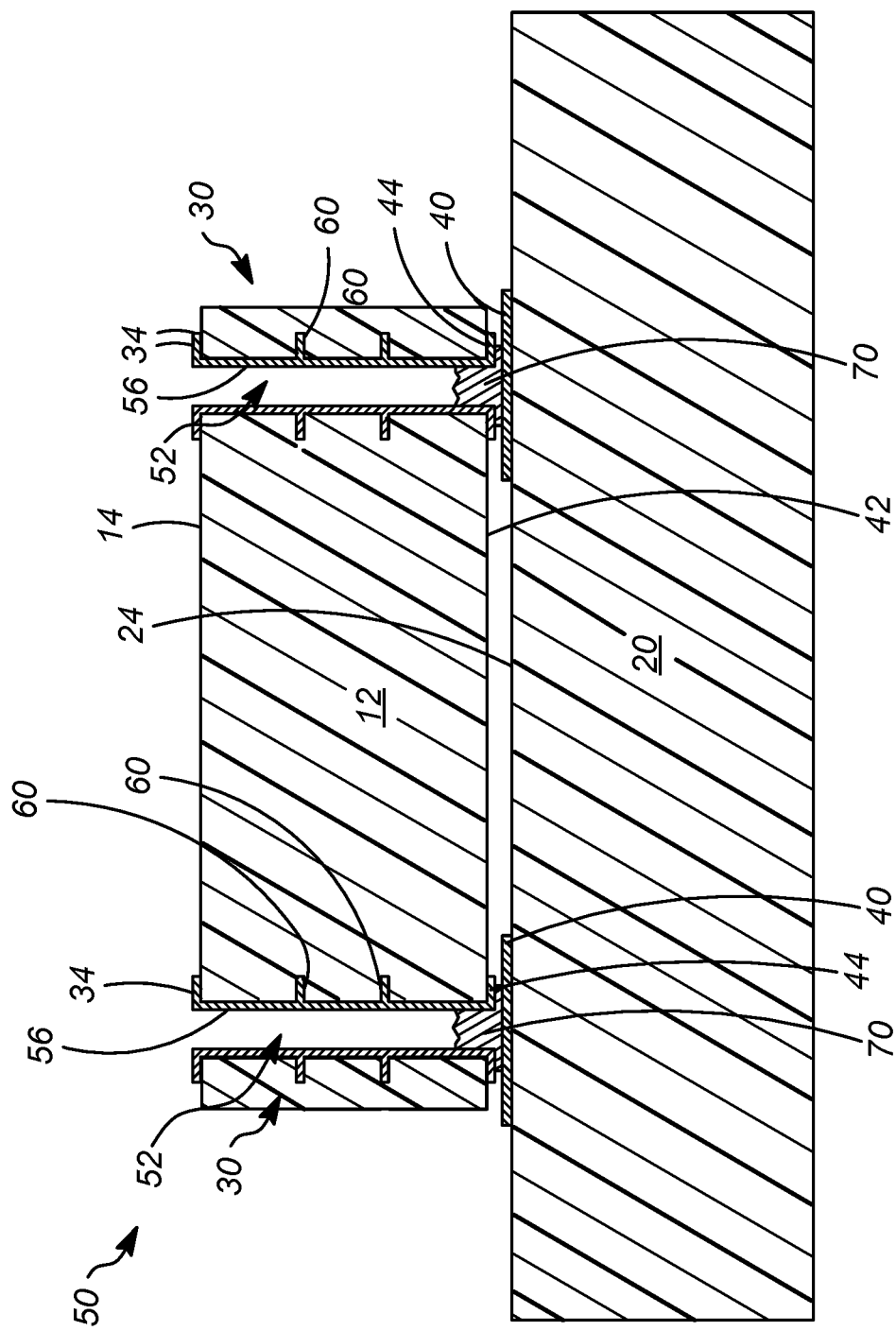
FIG. 4 is a lateral sectional view of the board assembly.

FIG. 4 shows a lateral cross section of the assembly 50 of the daughter circuit board 12 mounted on the mother circuit board 22. The edge trace 32 of the edge electrode 30 is not visible in FIG. 4. The edge electrode 30 may comprise a first top surface pad 34 and/or a first bottom surface pad 44. The opening 52 may extend from the first top surface 14 to the second bottom surface 42. The opening 52 may extend through the first top surface pad 34. The opening may extend through the first bottom surface pad 44. The opening 52 extends through the tab 60 or a plurality of tabs 60 as well. The annular plating 56 in the opening 52 may extend between the first top surface pad 34 to the first bottom surface pad 44. Solder 70 metallurgically and conductively bonds the annular plating 56 and/or the first bottom surface pad 44 to the second top surface pad 40.

The assembly 50 may comprise a plurality of edge electrodes 30 each comprising a first top surface pad 34 and/or a first bottom surface pad 44. A plurality of openings 52 may extend from the first top surface 14 to the second bottom surface 42. One or more of the openings 52 may extend through a respective first top surface pad 34. One or more of the openings may extend through a respective first bottom surface pad 44. One or more of the openings 52 may extend through a tab 60 or a plurality of tabs 60 as well. Annular platings 56 in respective openings 52 may extend between the respective first top surface pad 34 to the respective first bottom surface pad 44. Solder 70 metallurgically and conductively bonds the respective annular plating 56 and/or the respective first bottom surface pad 44 to the respective second top surface pad 40.

Provided is a daughter circuit board 12 that may be assembled to a mother circuit board 22 with a reliable metallurgical and conductive bond to provide the assembly 50.

Specific Embodiments

While the following is described in conjunction with specific embodiments, it will be understood that this description is intended to illustrate and not limit the scope of the preceding description and the appended claims.

A first embodiment of the disclosure is an assembly comprising a first circuit board comprising a first top surface with circuitry and a leading edge; the first circuit board having an edge electrode including a conductive edge trace on the leading edge, an opening in the first circuit board; a second circuit board having a second top surface with circuitry; the second circuit board having a conductive second top surface pad aligned with the opening and the edge trace in the first circuit board; and the opening in the first circuit board containing solder establishing a bond between the first circuit board and the second top surface pad. An embodiment of the disclosure is one, any or all of prior embodiments in this paragraph up through the first embodiment in this paragraph wherein the opening has an interior wall which is plated with a conductive annular plating. An embodiment of the disclosure is one, any or all of prior embodiments in this paragraph up through the first embodiment in this paragraph further comprising a first bottom surface of the first circuit board and a conductive first bottom surface pad on the first bottom surface. An embodiment of the disclosure is one, any or all of prior embodiments in this paragraph up through the first embodiment in this paragraph wherein the first bottom surface pad is aligned with the second top surface pad. An embodiment of the disclosure is one, any or all of prior embodiments in this paragraph up through the first embodiment in this paragraph further comprising a conductive connection between the first top surface pad through the opening to the first bottom surface pad. An embodiment of the disclosure is one, any or all of prior embodiments in this paragraph up through the first embodiment in this paragraph wherein the opening extends from the first top surface to the first bottom surface. An embodiment of the disclosure is one, any or all of prior embodiments in this paragraph up through the first embodiment in this paragraph further comprising a first bottom surface of the first circuit board and a conductive first bottom surface pad on the first bottom surface, the opening having an interior wall which is plated with a conductive annular plating establishing a conductive connection between the first top surface pad through the opening to the first bottom surface pad. An embodiment of the disclosure is one, any or all of prior embodiments in this paragraph up through the first embodiment in this paragraph wherein the first bottom surface pad is aligned with the second top surface pad and the solder establishes a conductive bond between the first bottom surface pad and the second top surface pad. An embodiment of the disclosure is one, any or all of prior embodiments in this paragraph up through the first embodiment in this paragraph wherein the conductive edge trace also provides a conductive connection between a first top surface pad and the second top surface pad.

A second embodiment of the disclosure is an circuit board comprising a first top surface with circuitry on the first top surface and a leading edge; the first circuit board having an edge electrode including a conductive first top surface pad on the first top surface contiguous with a conductive edge trace on the leading edge, an opening in the first circuit board aligned with the first top surface pad. An embodiment of the disclosure is one, any or all of prior embodiments in this paragraph up through the second embodiment in this paragraph wherein the opening has an interior wall which is plated with a conductive annular plating. An embodiment of the disclosure is one, any or all of prior embodiments in this paragraph up through the second embodiment in this paragraph further comprising a first bottom surface of the first circuit board and a conductive first bottom surface pad on the first bottom surface. An embodiment of the disclosure is one, any or all of prior embodiments in this paragraph up through the second embodiment in this paragraph further comprising a conductive connection extending from the first top surface pad through the opening to the first bottom surface pad. An embodiment of the disclosure is one, any or all of prior embodiments in this paragraph up through the second embodiment in this paragraph wherein the opening extends from the first top surface to the first bottom surface. An embodiment of the disclosure is one, any or all of prior embodiments in this paragraph up through the second embodiment in this paragraph further comprising a first bottom surface of the first circuit board and a conductive first bottom surface pad on the first bottom surface, the opening having an interior wall which is plated with a conductive annular plating establishing a conductive connection extending from the first top surface pad through the opening to the first bottom surface pad. An embodiment of the disclosure is one, any or all of prior embodiments in this paragraph up through the second embodiment in this paragraph wherein the conductive edge trace also provides a conductive connection between the first top surface pad and the second top surface pad.

A third embodiment of the disclosure is a method for assembling a first circuit board and a second circuit board comprising taking a first circuit board comprising a first top surface with circuitry and a leading edge; the first circuit board having an edge electrode including a conductive edge trace on the leading edge and an opening in the first circuit board; taking a second circuit board having a second top surface with circuitry; the second circuit board having a conductive second top surface pad; applying solder in the opening in the first circuit board or to the conductive second top surface pad; aligning the opening in the first circuit board with the second top surface pad; and mounting the first circuit board on the second circuit board such that the solder establishes a bond between the first circuit board and the second top surface pad. An embodiment of the disclosure is one, any or all of prior embodiments in this paragraph up through the third embodiment in this paragraph wherein the first circuit board has a first bottom surface and a conductive first bottom surface pad on the first bottom surface, and further comprising establishing a conductive bond between first bottom surface pad and the second top surface pad. An embodiment of the disclosure is one, any or all of prior embodiments in this paragraph up through the third embodiment in this paragraph wherein the opening has an interior wall which is plated with a conductive annular plating and further comprising establishing a conductive connection between a first top surface pad through the opening to the first bottom surface pad and the second top surface pad. An embodiment of the disclosure is one, any or all of prior embodiments in this paragraph up through the third embodiment in this paragraph further comprising establishing a conductive connection between the edge trace and the second top surface pad.

Without further elaboration, it is believed that using the preceding description that one skilled in the art can utilize the present invention to its fullest extent and easily ascertain the essential characteristics of this invention, without departing from the spirit and scope thereof, to make various changes and modifications of the invention and to adapt it to various usages and conditions. The preceding preferred specific embodiments are, therefore, to be construed as merely illustrative, and not limiting the remainder of the disclosure in any way whatsoever, and that it is intended to cover various modifications and equivalent arrangements included within the scope of the appended claims.

In the foregoing, all temperatures are set forth in degrees Celsius and, all parts and percentages are by weight, unless otherwise indicated.

The invention claimed is:

1. A circuit board assembly comprising:
   a first circuit board comprising a first top surface with circuitry and a leading edge; said first circuit board having an edge electrode including a conductive edge trace on said leading edge, an opening in said first circuit board and a first bottom surface having a conductive first bottom surface pad on said first bottom surface;
   a second circuit board having a second top surface with circuitry; said second circuit board having a conductive second top surface pad aligned with said opening, said first bottom surface pad and said edge trace in said first circuit board; and said opening in said first circuit board containing solder establishing a bond between said first circuit board and said second top surface pad, wherein said solder is configured to reflow at a junction of said edge trace of said first circuit board and said second top surface pad of said first circuit board to metallurgically and conductively bond said edge trace with said second top surface pad.

2. The assembly of claim 1 wherein said opening has an interior wall which is plated with a conductive annular plating.

3. The assembly of claim 1 wherein said first bottom surface pad is aligned with said second top surface pad.

4. The assembly of claim 3 further comprising a conductive connection between said first top surface pad through said opening to said first bottom surface pad.

5. The assembly of claim 1 wherein said opening extends from said first top surface to said first bottom surface.

6. The assembly of claim 1 further comprising a first bottom surface of said first circuit board and a conductive first bottom surface pad on said first bottom surface, said opening having an interior wall which is plated with a conductive annular plating establishing a conductive connection between said first top surface pad through said opening to said first bottom surface pad.

7. The assembly of claim 6 wherein said first bottom surface pad is aligned with said second top surface pad and said solder establishes a conductive bond between said first bottom surface pad and said second top surface pad.

8. The assembly of claim 1 wherein said conductive edge trace also provides a conductive connection between a first top surface pad and said second top surface pad.

9. A circuit board comprising:
a first top surface with circuitry on the first top surface and a leading edge; said first circuit board having an edge electrode including a conductive first top surface pad on said first top surface contiguous with a conductive edge trace on said leading edge, an opening in said first circuit board aligned with said first top surface pad and a first bottom surface having a conductive first bottom surface pad on said first bottom surface, said opening in said first circuit board containing solder configured to reflow at a junction of said edge trace of said first circuit board to metallurgically and conductively bond said edge trace of said first circuit board and a second top surface pad of said first circuit board.

10. The board of claim 9 wherein said opening has an interior wall which is plated with a conductive annular plating.

11. The board of claim 9 further comprising a conductive connection extending from said first top surface pad through said opening to said first bottom surface pad.

12. The board of claim 9 wherein said opening extends from said first top surface to said first bottom surface.

13. The board of claim 9 further comprising a first bottom surface of said first circuit board and a conductive first bottom surface pad on said first bottom surface, said opening having an interior wall which is plated with a conductive annular plating establishing a conductive connection extending from said first top surface pad through said opening to said first bottom surface pad.

14. The board of claim 9 wherein said conductive edge trace also provides a conductive connection between said first top surface pad and said second top surface pad.

15. A method for assembling a first circuit board and a second circuit board comprising:
taking a first circuit board comprising a first top surface with circuitry and a leading edge; said first circuit board having an edge electrode including a conductive edge trace on said leading edge and an opening in said first circuit board and wherein said first circuit board has a first bottom surface and a conductive first bottom surface pad on said first bottom surface;
taking a second circuit board having a second top surface with circuitry; said second circuit board having a conductive second top surface pad;
applying solder in said opening in said first circuit board or to said conductive second top surface pad;
aligning said opening in said first circuit board with said second top surface pad; and
mounting said first circuit board on said second circuit board such that said solder establishes a bond between said first circuit board and said second top surface pad; and
reflowing said solder at a junction of said edge trace of said first circuit board and said second top surface pad of said first circuit board to metallurgically and conductively bond said edge trace with said second top surface pad.

16. The method of claim 15 further comprising establishing a conductive bond between first bottom surface pad and said second top surface pad.

17. The method of claim 16 wherein said opening has an interior wall which is plated with a conductive annular plating and further comprising establishing a conductive connection between a first top surface pad through said opening to said first bottom surface pad and said second top surface pad.

18. The method of claim 15 further comprising establishing a conductive connection between said edge trace and said second top surface pad.

* * * * *

UNITED STATES PATENT AND TRADEMARK OFFICE
CERTIFICATE OF CORRECTION

| | |
|---|---|
| PATENT NO. | : 11,032,908 B2 |
| APPLICATION NO. | : 16/672193 |
| DATED | : June 8, 2021 |
| INVENTOR(S) | : Sreenivasu Balusu |

It is certified that error appears in the above-identified patent and that said Letters Patent is hereby corrected as shown below:

On the Title Page

Under "(65) Prior Publication Data US 2020/0389977 A1 Dec. 10, 2020", please insert:
--(30) Foreign Application Priority Data
June 7, 2019 (IN) ................ 201911022668--.

Signed and Sealed this
First Day of October, 2024

Katherine Kelly Vidal
*Director of the United States Patent and Trademark Office*